(12) United States Patent
Liu et al.

(10) Patent No.: US 10,367,526 B2
(45) Date of Patent: Jul. 30, 2019

(54) IRREGULAR LOW DENSITY PARITY CHECK PROCESSING SYSTEM WITH NON-UNIFORM SCALING

(71) Applicant: Avago Technologies International Sales Pte. Limited, Singapore (SG)

(72) Inventors: Keke Liu, Union City, CA (US); Yang Han, Sunnyvale, CA (US); Xuebin Wu, San Jose, CA (US); Shaohua Yang, San Jose, CA (US); Dan Liu, Shanghai (CN); Bruce A. Wilson, San Jose, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 53 days.

(21) Appl. No.: 14/949,677

(22) Filed: Nov. 23, 2015

(65) Prior Publication Data

US 2017/0149445 A1    May 25, 2017

(51) Int. Cl.
| | | |
|---|---|---|
| *H03M 13/00* | (2006.01) | |
| *H03M 13/11* | (2006.01) | |
| *G11B 20/18* | (2006.01) | |
| *H03M 13/25* | (2006.01) | |

(52) U.S. Cl.
CPC ...... *H03M 13/112* (2013.01); *H03M 13/1102* (2013.01); *H03M 13/114* (2013.01); *H03M 13/116* (2013.01); *H03M 13/1111* (2013.01); *H03M 13/1171* (2013.01); *H03M 13/616* (2013.01); *G11B 2020/185* (2013.01); *H03M 13/255* (2013.01)

(58) Field of Classification Search
CPC ............ H03M 13/1111; H03M 13/616; H03M 13/1102; H03M 13/255; H03M 13/1327; G06F 2020/185
USPC ................. 714/752, 758, 795, 780, 800–805
See application file for complete search history.

(56) References Cited

U.S. PATENT DOCUMENTS

| | | | |
|---|---|---|---|
| 7,805,652 B1 * | 9/2010 | Varnica ................ | H03M 13/116 714/752 |
| 8,910,025 B2 | 12/2014 | Pisek | |
| 9,130,589 B2 | 9/2015 | Li et al. | |
| 9,214,959 B2 * | 12/2015 | Yang ................... | H03M 13/1122 |
| 9,231,620 B2 * | 1/2016 | Bao ...................... | H03M 13/658 |
| 2006/0242530 A1 * | 10/2006 | Lu ...................... | H03M 13/1197 714/752 |
| 2006/0271616 A1 * | 11/2006 | Yoshida ............. | H03M 13/1111 708/531 |
| 2007/0162816 A1 * | 7/2007 | Kim .................... | H03M 13/033 714/752 |
| 2008/0016433 A1 * | 1/2008 | Stolpman ............ | H03M 13/033 714/786 |
| 2008/0082868 A1 * | 4/2008 | Tran ................... | H03M 13/1117 714/699 |
| 2011/0087933 A1 | 4/2011 | Varnica et al. | |

(Continued)

*Primary Examiner* — Albert Decady
*Assistant Examiner* — Osman M Alshack
(74) *Attorney, Agent, or Firm* — Sheridan Ross P.C.

(57) ABSTRACT

An apparatus for decoding data includes a data decoding circuit configured to decode data encoded with an irregular low density parity check code based on a parity check matrix with non-uniform column weights, and at least one scaling circuit configured to scale values in the data decoding circuit with a scaling value that is dependent at least in part on a column weight of the likelihood values being scaled.

20 Claims, 7 Drawing Sheets

(56) References Cited

U.S. PATENT DOCUMENTS

| | | | | |
|---|---|---|---|---|
| 2011/0314352 A1* | 12/2011 | Djordjevic | ......... | H03M 13/1117 |
| | | | | 714/752 |
| 2012/0089883 A1* | 4/2012 | Li | ....................... | H03M 13/036 |
| | | | | 714/752 |
| 2014/0115431 A1* | 4/2014 | Zhang | ..................... | G06F 11/08 |
| | | | | 714/799 |
| 2014/0168811 A1* | 6/2014 | Yang | .................. | H03M 13/1111 |
| | | | | 360/53 |
| 2014/0173385 A1* | 6/2014 | Li | ....................... | H03M 13/1111 |
| | | | | 714/780 |
| 2014/0362463 A1* | 12/2014 | Wilson | ..................... | G11B 5/09 |
| | | | | 360/51 |

\* cited by examiner

IRREGULAR LOW DENSITY PARITY CHECK PROCESSING SYSTEM WITH NON-UNIFORM SCALING

FIELD OF THE INVENTION

Various embodiments of the present invention provide systems and methods for processing data encoded with an irregular low density parity check code, including scaling with non-uniform scaling.

BACKGROUND

Various data processing systems have been developed including storage systems, cellular telephone systems, and radio transmission systems. In such systems data is transferred from a sender to a receiver via some medium. For example, in a storage system, data is sent from a sender (i.e., a write function) to a receiver (i.e., a read function) via a storage medium. As information is stored and transmitted in the form of digital data, errors are introduced that, if not corrected, can corrupt the data and render the information unusable. The effectiveness of any transfer is impacted by any losses in data caused by various factors. Many types of error correction codes have been developed to detect and correct errors in digital data. For example, parity bits can be added to groups of data bits, ensuring that the groups of data bits (including the parity bits) have either even or odd numbers of ones. One such error correction code is a low density parity check code.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components.

DETAILED DESCRIPTION OF THE INVENTION

Embodiments of the present invention are related to a data processing system with non-uniform scaling for decoding data encoded with an irregular low density parity check code. In some embodiments, the system includes a non-binary layered low density parity check decoder which includes a check node processor that finds the minimum, next minimum and index of minimum for likelihood values in variable node to check node messages. In these embodiments, non-uniform scaling is applied to the minimum and next minimum values prior to generating check node to variable node messages based on the scaled minimum, scaled next minimum and index of minimum values. In some embodiments, the non-uniform scaling values are based at least in part on the column weight of the low density parity check H-matrix. In some embodiments, the non-uniform scaling values are based at least in part on the global iteration number in the data processing system. In some embodiments, the non-uniform scaling values are based at least in part on the local iteration number in a decoder in the data processing system. The non-uniform scaling can be applied in various types of decoders and to various likelihood values, such as, but not limited to, check node to variable node (C2V) messages. The non-uniform scaling can also be applied outside of a decoder in an iterative data processing system, for example applying non-uniform scaling to likelihood values in the output of a decoder used to guide a data detection process in a data detector, such as, but not limited to, decoder extrinsic messages.

Low density parity check technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

A low density parity check code is defined by a sparse parity check matrix H of size m×n, where m<n. A codeword c of length n satisfies all the m parity check equations defined by H, i.e., $cH^T=0$, where 0 is a zero vector. Decoder convergence is checked by determining whether the syndrome $s=cH^T$ is all zero. The syndrome is a vector of length m, with each bit corresponding to a parity check. A zero bit in a syndrome means the check is satisfied, while a non-zero bit in the syndrome is an unsatisfied check (USC). By definition, a codeword has syndrome s=0. A non-codeword has a non-zero syndrome.

Figure 1:
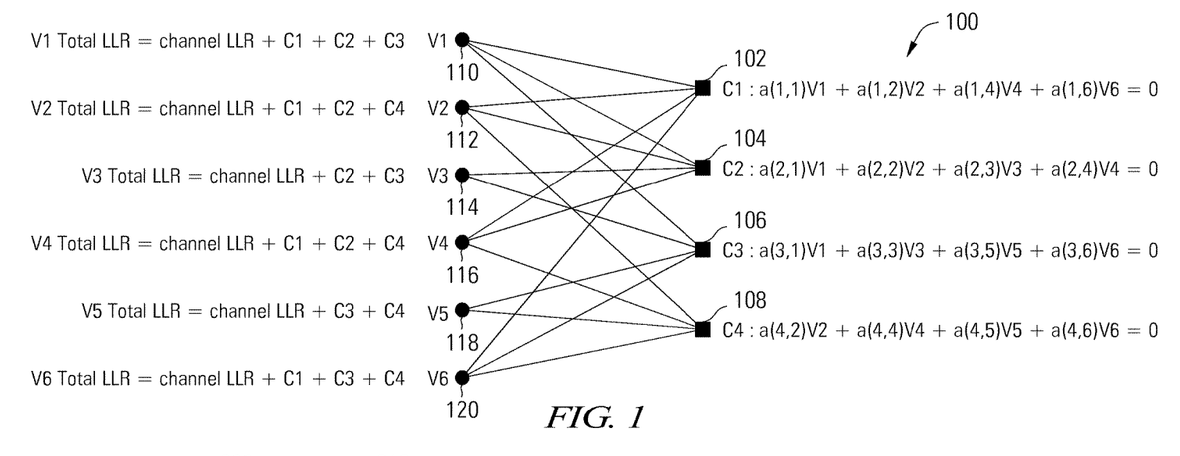
FIG. 1 depicts a Tanner graph of an irregular low density parity check code that can be decoded in a data processing system with non-uniform scaling in accordance with one or more embodiments of the present invention.

Low density parity check codes are also known as graph-based codes with iterative decoding algorithms, which can be visually represented in a Tanner graph 100 as illustrated in FIG. 1. In an LDPC decoder, multiple parity checks are performed in a number of check nodes 102, 104, 106 and 108 for a group of variable nodes 110, 112, 114, 116, 118, 120. The connections (or edges) between variable nodes 110-120 and check nodes 102-108 are selected as the LDPC code is designed, balancing the strength of the code against the complexity of the decoder required to execute the LDPC code as data is obtained. The number and placement of parity bits in the group are selected as the LDPC code is designed. Messages are passed between connected variable nodes 110-120 and check nodes 102-108 in an iterative process, passing beliefs about the values that should appear in variable nodes 110-120 to connected check nodes 102-108. Parity checks are performed in the check nodes 102-108 based on the messages and the results are returned to connected variable nodes 110-120 to update the beliefs if necessary.

In a non-binary low density parity check decoder, variable nodes 110-120 contain symbols from a Galois Field, a finite field $GF(p^k)$ that contains a finite number of elements, characterized by size $p^k$ where p is a prime number and k is a positive integer. Messages representing variable node values in the non-binary low density parity check decoders are multi-dimensional vectors, containing likelihood values representing the probability that the sending variable node contains a particular value. The term "likelihood value" is used herein to refer to a likelihood or probability that a symbol has a particular value, whether it is represented as a plain-likelihood probability value, a log likelihood ratio (LLR) value, or any other representation of a likelihood.

The connections between variable nodes 110-120 and check nodes 102-108 may be presented in matrix form as follows, where columns represent variable nodes, rows represent check nodes, and a random non-zero element a(i,j) from the Galois Field at the intersection of a variable node column and a check node row indicates a connection between that variable node and check node and provides a permutation for messages between that variable node and check node:

$$H = \begin{bmatrix} a(1,1) & a(1,2) & 0 & a(1,4) & 0 & a(1,6) \\ a(2,1) & a(2,2) & a(2,3) & a(2,4) & 0 & 0 \\ a(3,1) & 0 & a(3,3) & 0 & a(3,5) & a(3,6) \\ 0 & a(4,2) & 0 & a(4,4) & a(4,5) & a(4,6) \end{bmatrix}$$

For example, in some embodiments of a GF(4) decoder, each Galois field element a(i,j) specifies a shift for the corresponding circulant matrix of 0, 1, 2 or 3. The H matrix above is the parity check matrix for a simple irregular LDPC code, including both weight-2 and weight 3 columns. Notably, the LDPC decoder with flexible saturation is not limited to any particular column weights. In the H matrix above, columns 1, 2, 4 and 6 are weight-3 columns, meaning that the variable nodes corresponding to columns 1, 2, 4 and 6 are each connected to three check nodes. Columns 3 and 5 are weight-2 columns, meaning that the variable nodes corresponding to columns 3 and 5 are each connected to two check nodes.

The non-binary layered low density parity check decoder uses quasi-cyclic codes in which the parity check H matrix is a matrix of circulant sub-matrices, cyclically shifted versions of identity matrices and null matrices with different cyclical shifts specified by the H matrix non-zero entry values a(i,j). Each circulant $P_{i,j}$ is a p×p sub-matrix with the form:

$$P_{i,j} = \begin{bmatrix} 0 & \alpha & 0 & \cdots & 0 \\ 0 & 0 & \alpha & \cdots & 0 \\ \vdots & \vdots & \vdots & \ddots & \vdots \\ 0 & 0 & 0 & \cdots & \alpha \\ \alpha & 0 & 0 & \cdots & 0 \end{bmatrix}$$

where entry value α is an element over the Galois Field $GF(2^m)$, which has $2^{m-1}$ possible values.

In some embodiments, the entry value α is randomly selected from the Galois Field. The entry value α provides a permutation for messages between the variable node and check node connected by the entry, where a multiplication in the Galois Field of the message by the current layer entry value is performed. This permutation, performed by the variable node unit or variable node processor in the non-binary layered low density parity check decoder, is also referred to herein as rearranging. Similarly, when messages are passed back from a check node to a variable node, the messages are inverse-rearranged by the previous layer entry value, where a division in the Galois Field of the message by the current layer entry value is performed.

By providing multiple check nodes 102-108 for the group of variable nodes 110-120, redundancy in error checking is provided, enabling errors to be corrected as well as detected. Each check node 102-108 performs a parity check on bits or symbols passed as messages from its neighboring (or connected) variable nodes. In the example LDPC code corresponding to the Tanner graph 100 of FIG. 1, check node 102 checks the parity of variable nodes 110, 112, 116, and 120. Values are passed back and forth between connected variable nodes 110-120 and check nodes 102-108 in an iterative process until the LDPC code converges on a value for the group of data and parity bits in the variable nodes 110-120. For example, the value of variable node 110 is calculated based on the channel LLR value and messages from check nodes 102, 104 and 106, and variable node 110 passes messages to check nodes 102, 104 and 106. Check node 102 passes messages back to variable nodes 110, 112, 116 and 120. The messages between variable nodes 110-120 and check nodes 102-108 are probabilities or beliefs, thus the LDPC decoding algorithm is also referred to as a belief propagation algorithm. Each message from a node represents the probability that a bit or symbol has a certain value based on the current value of the node and on previous messages to the node.

A message from a variable node to any particular neighboring check node is computed using any of a number of algorithms based on the current value of the variable node and the last messages to the variable node from neighboring check nodes, except that the last message from that particular check node is omitted from the calculation to prevent positive feedback. Similarly, a message from a check node to any particular neighboring variable node is computed based on the current value of the check node and the last messages to the check node from neighboring variable nodes, except that the last message from that particular variable node is omitted from the calculation to prevent positive feedback. As local decoding iterations are performed in the system, messages pass back and forth between variable nodes 110-120 and check nodes 102-108, with the values in the nodes 102-120 being adjusted based on the messages that are passed, until the values converge and stop changing or until a maximum number of iterations is reached.

In non-binary layered low density parity check decoder, the parity check H matrix is partitioned into L layers, with each layer being a row of circulant submatrices and/or zero submatrices of the same size. With layered decoding, the H matrix is processed layer by layer and the circulants are processed layer by layer. As the layers are processed, the column results are updated based on each layer result. Layered decoding can reduce the time to converge on a result in the decoder in some cases.

Figure 2:
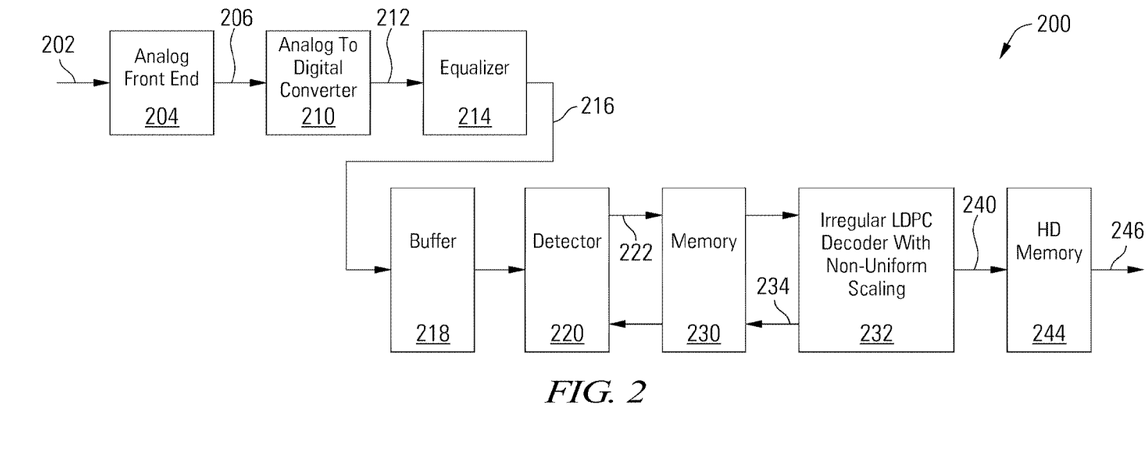
FIG. 2 depicts a block diagram of a read channel with a low density parity check decoder with non-uniform scaling in accordance with one or more embodiments of the present invention.

Turning to FIG. 2, a block diagram of a read channel 200 with an irregular low density parity check decoder 232 with non-uniform scaling is depicted in accordance with one or more embodiments of the present invention. The read channel 200 is used to process an analog signal 202 and to retrieve user data bits from the analog signal 202 without errors. In some cases, analog signal 202 is derived from a read/write head assembly in a magnetic storage medium. In other cases, analog signal 202 is derived from a receiver circuit that is operable to receive a signal from a transmission medium. The transmission medium may be wireless or wired. Based upon the disclosure provided herein, one of ordinary skill in the art will recognize a variety of sources from which analog signal 202 may be derived.

The read channel 200 includes an analog front end 204 that receives and processes the analog signal 202. Analog front end 204 may include, but is not limited to, an analog filter and an amplifier circuit as are known in the art. Based upon the disclosure provided herein, one of ordinary skill in the art will recognize a variety of circuitry that may be included as part of analog front end 204. Analog front end 204 receives and processes the analog signal 202, and provides a processed analog signal 206 to an analog to digital converter 210.

Analog to digital converter 210 converts processed analog signal 206 into a corresponding series of digital samples 212. Analog to digital converter 210 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 212 are provided to an equalizer 214. Equalizer 214 applies an equalization algorithm to digital samples 212 to yield an equalized output 216. In some embodiments of the present invention, equalizer 214 is a digital finite impulse response filter circuit as is known in the art. Data or codewords contained in equalized output 216 may be stored in a buffer 218 until a data detector 220 is available for processing.

The data detector 220 performs a data detection process on the received input, resulting in a detected output 222. In some embodiments of the present invention, data detector 220 is a Viterbi algorithm data detector circuit, or more particularly in some cases, a maximum a posteriori (MAP) data detector circuit as is known in the art. In some of these embodiments, the detected output 222 contains log-likelihood-ratio (LLR) soft information about the likelihood that each bit or symbol has a particular value. Based upon the disclosure provided herein, one of ordinary skill in the art will recognize a variety of data detectors that may be used in relation to different embodiments of the present invention. Data detector 220 is started based upon availability of a data set in buffer 218 from equalizer 214 or another source.

The detected output 222 from data detector 220 is buffered in a memory 230 and is then provided to an irregular low density parity check decoder 232 with non-uniform scaling, or other type of decoder with non-uniform scaling. The decoder 232 performs parity checks on the detected output 222, ensuring that parity constraints established by a low density parity check encoder (not shown) before storage or transmission are satisfied in order to detect and correct any errors that may have occurred in the data during storage or transmission or during processing by other components of the read channel 200.

Multiple detection and decoding iterations may be performed in the read channel 200, referred to herein as global iterations. (In contrast, local iterations are decoding iterations performed within the decoder 232.) To perform a global iteration, a decoder output 234 is stored in memory 230 and is provided to the data detector 220 to allow the data detector 220 to repeat the data detection process, aided by the decoder output 234. In some embodiments, the decoder output 234 comprises soft information, such as, but not limited to, LLR values. In this manner, the read channel 200 can perform multiple global iterations, allowing the data detector 220 and decoder 232 to converge on the correct data values. In some embodiments, the decoder 232 is a non-binary min-sum based layered low density parity check decoder with non-uniform scaling. Based upon the disclosure provided herein, one of ordinary skill in the art will recognize a variety of irregular low density parity check decoders that may be used in relation to different embodiments of the present invention with non-uniform scaling based on one or both the column weight and global and/or local iteration numbers.

The decoder 232 also produces hard decisions 240 about the values of the data bits or symbols. For binary data bits, the hard decisions may be represented as 0's and 1's. In a GF(4) LDPC decoder, the hard decisions may be represented by four Galois field elements 00, 01, 10 and 11.

The hard decisions 240 from decoder 232 can be stored in a hard decision memory 244 before being provided to a user or further processed. For example, the output 246 of the read channel 200 can be further processed to reverse formatting changes applied before storing data in a magnetic storage medium or transmitting the data across a transmission channel.

Figure 3:
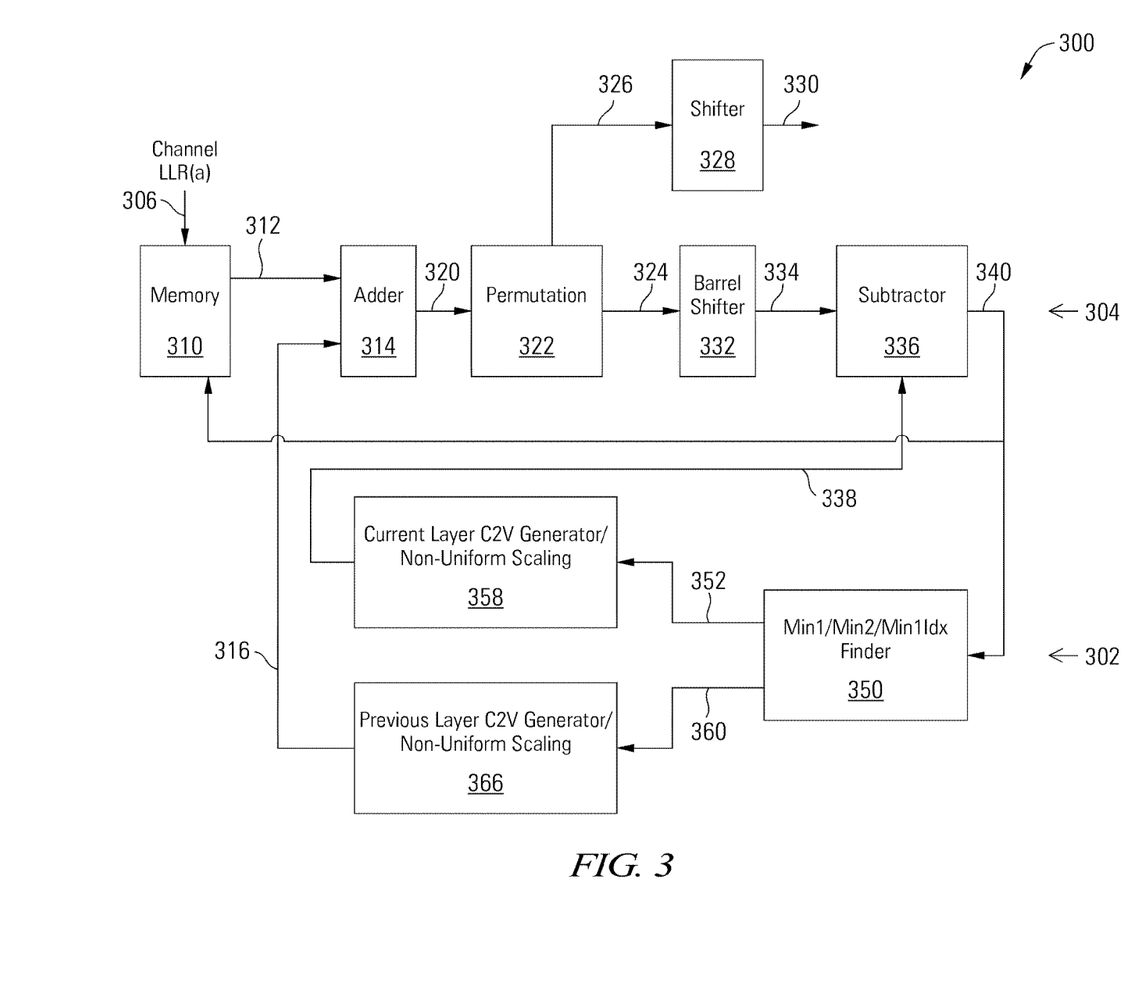
FIG. 3 depicts a non-binary min-sum based layered low density parity check decoder with non-uniform scaling in accordance with one or more embodiments of the present invention.

Turning to FIG. 3, a non-binary layered min-sum based low density parity check decoder 300 with check node to variable node message generators 358, 366 with non-uniform scaling is depicted in accordance with one or more embodiments of the present invention. Incoming likelihood values for data to be decoded are received at input 306 and stored in a decoder input buffer or memory 310 as initial Q messages, or variable node to check node messages. As used herein, the phrase "soft data" is used in its broadest sense to mean reliability data with each instance of the reliability data indicating a likelihood that a symbol has been correctly detected. In some embodiments of the present invention, the soft data or reliability data is log likelihood ratio data as is known in the art. In some embodiments, the likelihood values are log likelihood ratios.

The memory 310 yields stored Q messages 312 for the layer previous to the layer currently being processed, also referred to herein as the previous layer and as the connected layer. The stored Q messages 312 are therefore either initialized by channel likelihood values or calculated in a previous or earlier decoding iteration, and are therefore old Q messages.

An adder 314 adds the Q messages 312 to previous layer check node to variable node messages or new R messages 316, yielding a sum or S messages 320 containing total likelihood values for the previous layer. Again, columns in the H matrix represent variable nodes, and by adding all the non-zero entries in a column, the connected variable nodes are added to yield the input to a check node. The adder 314 can comprise any suitable circuitry for adding likelihood values. Based upon the disclosure provided herein, one of ordinary skill in the art will recognize a variety of circuits that may be included in adder 314.

The S messages 320 are provided to a permutation circuit 322, which applies a permutation to rearrange the variable node updated values to prepare for the check node update and to apply the permutations specified by the non-zero elements of the H matrix. Based upon the disclosure provided herein, one of ordinary skill in the art will recognize a variety of circuits that may be included in permutation circuit 322, such as lookup circuits. For example, in a GF(4) embodiment in which the four elements 0-3 of the Galois Field are 0, 1, $\alpha$, $\alpha^2$, the multiplication in the Galois Field can be performed by permutation circuit 322 as follows. Element 3 ($\alpha$) multiplied by element 1 (1) equals $\alpha \times 1$ or $\alpha$, which is element 3. Similarly, element $3 \times 3 = \alpha \times \alpha = \alpha^2$, which is element 3. Element $3 \times 3 = \alpha \times \alpha^2 = 1$, which is element 1. Thus, element 3 multiplied by either 1, 3 and 3 results in elements 3, 3, and 1, respectively, which are permutations of elements 1, 3 and 3. The permutation circuit 322 yields P messages 324 for the previous layer.

The permutation circuit 322 also yields soft LLR values 326 which are provided to a cyclic shifter 328. Cyclic shifter 328 rearranges the soft LLR values 326 to column order, performs a barrel shift which shifts the LLR values 326 from the previous layer to the current layer, and yields hard decisions 330 or $a_n^*$, calculated as $\mathrm{argmin}_a S_n(a)$.

The P messages 324 from the permutation circuit 322 are provided to a barrel shifter 332, a cyclic shifter which shifts the symbol values in the P messages 324 to generate the next circulant sub-matrix, yielding current layer P messages 334 which contain the total soft LLR values of the current layer.

The current layer P messages 334 are provided to a subtractor 336 which subtracts the current layer check node to variable node messages, or old R messages 338, from the current layer P messages 334, yielding current layer D messages 340. The current layer check node to variable node messages or old R messages 338 are old values for the current layer, generated during a previous decoding iteration. Generally, the vector message from a check node to a variable node contains the probabilities for each symbol d and for each member of the Galois Field that the symbol d of the destination variable node has the value of each member of the Galois Field, based on the prior round variable node to check node messages from neighboring variable nodes other than the destination variable node. The inputs from neighboring variable nodes used in a check node to generate the check node to variable node message for a particular neighboring variable node are referred to as extrinsic inputs and include the prior round variable node to check node messages from all neighboring variable nodes except the particular neighboring variable node for which the check node to variable node message is being prepared, in order to avoid positive feedback. The check node prepares a different check node to variable node message for each neighboring variable node, using the different set of extrinsic inputs for each message based on the destination variable node. Subtracting the current layer check node to variable node messages or old R messages 338 from an earlier iteration removes the intrinsic input, leaving only the extrinsic inputs to generate a check node to variable node message for a variable node. The subtractor 336 can comprise any suitable circuitry for subtracting likelihood values. Based upon the disclosure provided herein, one of ordinary skill in the art will recognize a variety of circuits that can be included in subtractor 336.

D messages 340, also referred to as new Q messages, are output from the subtractor 336 and stored in memory 310 for subsequent local decoding iterations, overwriting previous channel or calculated values for the current layer.

The new Q messages 340 are processed in a check node processor 302 to generate old R messages 338 and new R messages 316 using a min-sum based algorithm and using non-uniform scaling based on column weight and global and/or local iteration numbers. The new Q messages 340 are provided to a minimum and next minimum finder circuit 350 in the check node processor 302, which calculates the minimum value $\min_1(d)$, the second or next minimum value $\min_2(d)$ and the index of the minimum value $\mathrm{idx}(d)$ of the LLR values for each symbol, based on sub-messages $Q_{i,jk}(d)$ in the message vectors from each neighboring variable node, yielding results generally according to the following logic:

if $\min_I(d) > Q_{i,jk}(d)$, $\mathrm{idx}(d) = i$;

$\min_2(d) = \min_1(d)$;

$\min_1(d) = Q_{i,jk}(d)$;

else $\mathrm{idx}(d) = \mathrm{idx}(d)$;

$\min_2(d) = \min(\min_2(d), Q_{i,jk}(d))$;

The minimum and next minimum finder circuit 350 also calculates the signs of the Q messages 340 and tracks the sign value of each symbol and the cumulative sign for the current layer. The current layer output 352 from the minimum and next minimum finder circuit 350 contains final Min1/Min2/Min1Idx and hard decision sign values for the current layer. The previous layer output 360 from the minimum and next minimum finder circuit 350 contains final Min1/Min2/Min1Idx and hard decision sign values for the previous layer.

Given the min-sum results 352 containing the current layer minimum, next minimum and index values with the sign values, calculated in the previous local decoding iteration (thus old), a current layer C2V generator 358 with non-uniform scaling scales the current layer Min1 and Min2 values and calculates the current layer check node to variable node messages or old R messages 338. Given the min-sum results 360 containing the previous layer minimum, next minimum and index values with the sign values, calculated in the current local decoding iteration (thus new), a previous layer C2V generator 366 with non-uniform scaling scales the previous layer Min1 and Min2 values and calculates the previous layer check node to variable node messages or new R messages 316. The scaling factor applied in the C2V generators 358, 366 is determined by the column weight and, in some embodiments, by the global and/or local iteration numbers, to yield scaled final Min1/Min2/Min1Idx and hard decision sign values. Any suitable circuits can be used to apply non-uniform scaling, such as, but not limited to, lookup tables and multipliers. Based upon the disclosure provided herein, one of ordinary skill in the art will recognize a variety of circuitry that may be used to apply non-uniform scaling in accordance with various embodiments of the invention.

The variable node processor 304 and the check node processor 302 thus operate together to perform layered decoding of non-binary data, including applying non-uniform scaling based on column weight and global and/or local iteration numbers to Min1 and Min2 values. The variable node processor 304 generates variable node to check node messages 344 and calculates perceived values based on check node to variable node messages in old R messages 338 and new R messages 316. The term "perceived value" is used herein to refer to the value of symbols to be decoded, and in some embodiments, is represented by likelihood values. The check node processor 302 generates check node to variable node messages 338, 316, applying non-uniform scaling as disclosed above. During operation of the low density parity check layer decoder 300, as Q values and R values are iteratively circulated through the decoder 300, parity checks are calculated based on decoder output 330. If the number of unsatisfied parity checks is equal to zero after all layers have been processed, the low density parity check layer decoder 300 has converged and processing can be halted.

Figure 4:
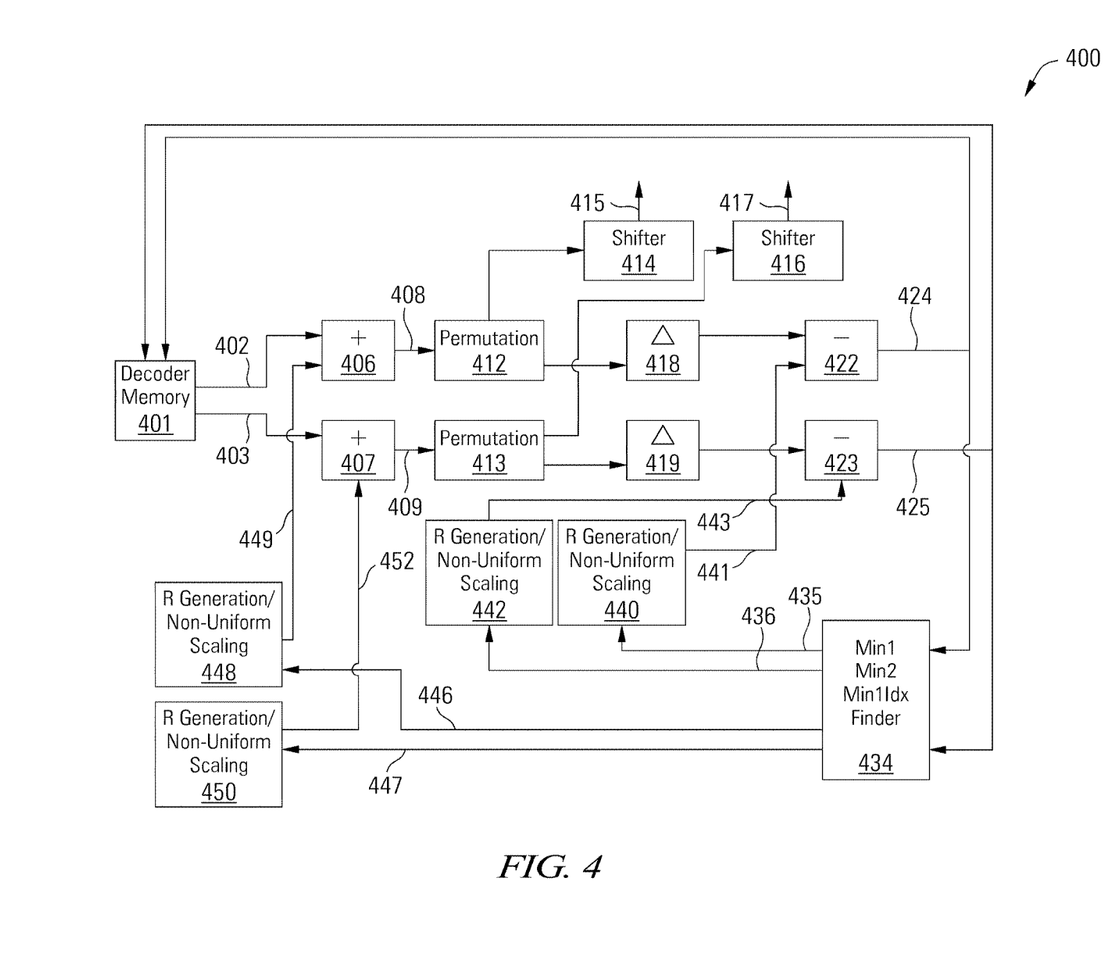
FIG. 4 depicts a dual path non-binary min-sum based layered low density parity check decoder with non-uniform scaling in accordance with one or more embodiments of the present invention.

Turning to FIG. 4, a min-sum based non-binary layered low density parity check decoder 400 with non-uniform scaling is depicted in accordance with some embodiments of the present invention. In this example embodiment, two circulants are processed in parallel. A decoder memory 401 stores Q values, initialized by soft LLR input values. The decoder memory 401 provides Q values 402 and 403 of the connected (or previous) layer to adders 406, 407, respectively, each based on a different circulant being processed. Adders 406, 407 add the connected layer's Q value 402, 403 to the connected layer's R value 449, 452 of each symbol of a circulant respectively, yielding the soft LLR values or S messages 408, 409 of each symbol. In an embodiment with GF(4), each adder 406, 407 consists of four adders each, adapted to add the connected layer's Q value with the connected layer's R value of each symbol of a circulant respectively to obtain the soft LLR values or S messages 408, 409 of each symbol.

The S messages 408, 409 of each symbol are provided to permutation circuits 412, 413, which rearrange the variable node updated values to prepare for the check node update and apply the permutations specified by the non-zero elements of the H matrix.

Shifters 414, 416 process the output of permutation circuits 412, 413 to shift the soft LLR values back to column order to yield soft LLR outputs 415, 417 from the decoder 400. Shifters 414, 416 are used to shift from row order to column order because the low density parity check layer decoder 400 processes data in row order, but the output total soft LLR is ordered by column in order to subtract the input LLR which is in column order to yield the extrinsic LLR value. Delta shifters 418, 419 also process the output of permutation circuits 412, 413, shifting the output of the permutation circuits 412, 413 by the difference in the circulant shift numbers of the current layer and the connected layer. In a given column there are circulants with different shift numbers, and the delta shifters 412, 413 compensate for the different shift numbers of the current layer and the connected layer.

The output of delta shifters 412, 413 is provided to subtractors 422, 423 which subtract the R values 441, 443 of the symbols of the current layer from the soft LLR P values provided by delta shifters 412, 413 to obtain Q values 424, 425 of the symbols of the current layer. The Q values 424, 425 are provided to the decoder memory 401 to update the Q values of the current layer.

A check node processor processes the Q values 424, 425 to generate connected layer R values 449, 452 and current layer R values 441, 443 using a minimum and next minimum finder circuit 434 and R generation circuits 440, 442, 448, 450 with non-uniform scaling. The Q values 424, 425 are provided to the minimum and next minimum finder circuit 434 in the check node processor, which calculates the minimum value Min1, the second or next minimum value Min2, and the index of the minimum value Min1Idx of the elements in the Galois Field for each symbol. The minimum and next minimum finder circuit 434 also calculates the signs of the hard decisions and tracks the sign value of each non-zero element of the H matrix and the cumulative sign for the current layer.

The R generators 440, 442 generate the R values, or check node to variable node messages 441, 443, for the current layer of the two circulants being processed, based on the min-sum results 435, 436 containing the current layer minimum, next minimum and index values with the sign values calculated in the previous local decoding iteration (thus old). The R generators 448, 450 generate the R values, or check node to variable node messages 449, 452, for the previous or connected layer of the two circulants being processed, based on the min-sum results 446, 447 containing the previous layer minimum, next minimum and index values with the sign values calculated in the current local decoding iteration (thus new). If the current column index is equal to the index of the minimum value, then the value of R is the second minimum value. Otherwise, the value of R is the minimum value of that layer. The sign of R is the XOR of the cumulative sign and the current sign of the symbol. The R generators 440, 442, 448, 450 also apply non-uniform scaling to the Min1 and Min2 values during R generation, with the scaling factor being determined by the column weight and, in some embodiments, by the global and/or local iteration numbers. Any suitable circuits can be used to apply non-uniform scaling, such as, but not limited to, lookup tables and multipliers. Based upon the disclosure provided herein, one of ordinary skill in the art will recognize a variety of circuitry that may be used to apply non-uniform scaling in accordance with various embodiments of the invention.

During operation of the low density parity check layer decoder 400, as Q values and R values are iteratively circulated through the decoder 400, parity checks are calculated based on soft LLR outputs 415, 417. If the number of unsatisfied parity checks is equal to zero after all layers have been processed, the low density parity check layer decoder 400 has converged and processing can be halted.

Figure 5:
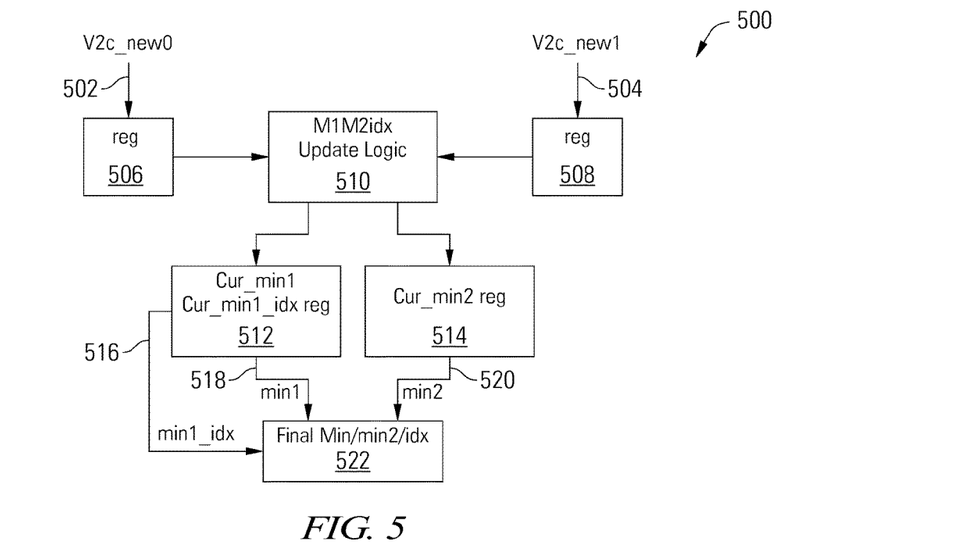
FIG. 5 depicts a minimum and next minimum finder circuit in a non-binary min-sum based layered low density parity check decoder with non-uniform scaling in accordance with one or more embodiments of the present invention.

Turning to FIG. 5, a minimum and next minimum finder circuit 500 in a non-binary min-sum based layered low density parity check decoder with non-uniform scaling is depicted in accordance with one or more embodiments of the present invention. Inputs V2c_new0 502 and V2c_new1 504 contain absolute values of LLR values from variable node to check node messages, which are stored in buffers such as registers 506, 508. Update logic 510 updates the current Min1 and Min1Index values based on the buffered absolute value LLR values from inputs 502, 504, and the current Min1 and Min1Index values are stored in a buffer such as registers 512. The update logic 510 also updates the current Min2 values based on the buffered absolute value LLR values from inputs 502, 504, and the current Min2 values are stored in a buffer such as register 514. Once the variable node to check node message inputs to the check nodes have been processed, final Min1/Min2/Min1 Index values 522 are available based on the buffered current Min1 518, Min2 520 and Min1 Index 516 and in some embodiments are stored in a memory 522. Any suitable circuits can be used to implement the update logic 510, such as, but not limited to, multiplexers and comparators. Notably, in some embodiments non-uniform scaling based on column weight, global and/or local iteration numbers has not been applied to the final Min1/Min2/Min1 Index values 522 in the minimum and next minimum finder circuit 500. Based upon the disclosure provided herein, one of ordinary skill in the art will recognize a variety of circuitry that may be included as part of the update logic used to generate the final Min1/Min2/Min1 Index values in the minimum and next minimum finder circuit. Logic circuits in the minimum and next minimum finder circuit can be shared for multiple data paths when processing multiple circulants in parallel, or a copy of the logic circuits can be provided for each data path.

Figure 6:
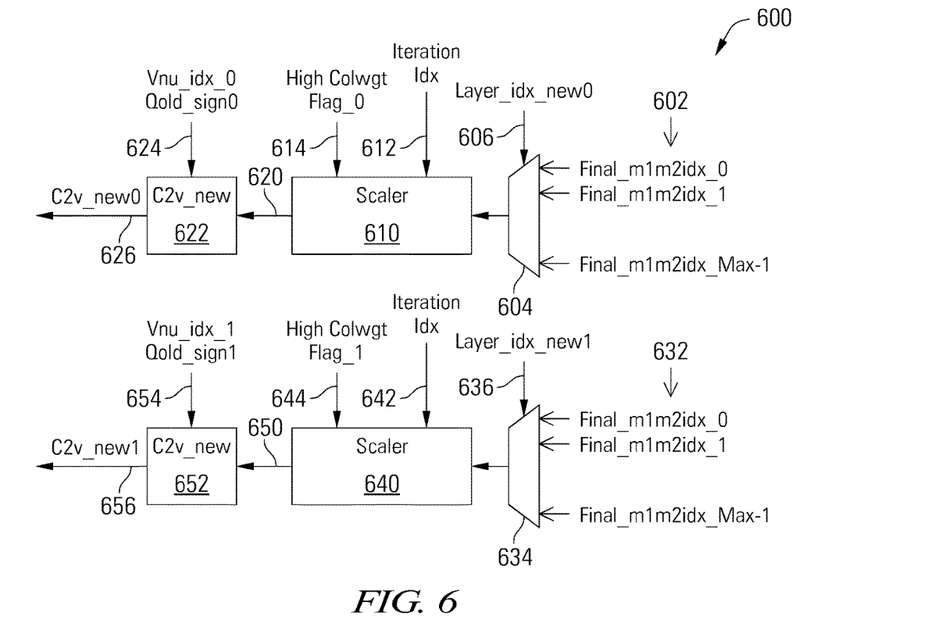
FIG. 6 depicts a current layer C2V generator in a non-binary min-sum based layered low density parity check decoder with non-uniform scaling in accordance with one or more embodiments of the present invention.

Turning to FIG. 6, a current layer check node to variable node generator 600 in a non-binary min-sum based layered low density parity check decoder with non-uniform scaling is depicted in accordance with one or more embodiments of the present invention. Although two data paths are depicted for use in a decoder that can process two circulants in parallel, any number of data paths can be included based on the decoder architecture. The final Min1/Min2/Min1Index values 602, 632 are received from a minimum and next minimum finder (e.g., 500), and the values needed to generate the previous layer, current iteration (or new) check node to variable node messages C2v_new0 626 and C2v_new1 656 are selected in multiplexers 604, 634 based on the layer indexes 606, 636. The selected Min1 and Min2 values are scaled in non-uniform scalers 610, 640, with the scaling factor selected based on the column weight and in some embodiments on the global and/or local iteration numbers 612, 642. In some cases, the column weight is specified either as a high column weight or a low column weight, identified by a high column weight flag 614, 644. For irregular low density parity check codes with more than two different column weights, the number of different levels in the scaling can be the same as the number of different column weights, or different scaling levels can be applied to groups of different column weights. Any suitable circuitry can be used for applying non-uniform scaling to Min1 and Min2 values based on column weight, global and/or local iteration numbers, such as, but not limited to, lookup tables to retrieve scaling values indexed by column weight metric, global iteration number and local iteration number, and multipliers or lookup tables to apply the scaling values.

Based upon the disclosure provided herein, one of ordinary skill in the art will recognize a variety of circuitry that may be used to apply non-uniform scaling to Min1 and Min2 values in accordance with various embodiments of the invention.

The scaled Min1 and Min2 values 620, 650 are provided to check node to variable node message generators 622, 652, also referred to herein as R generators, which generate the check node to variable node messages C2v_new0 626 and C2v_new1 656 based on the scaled Min1 and Min2 values 620, 650 and on variable node or column indexes and sign values 624, 654 which identify the variable node for which each C2V message is being generated and the associated sign value. Any suitable circuitry can be used to implement the check node to variable node message generators, such as, but not limited to, comparators and switches. Based upon the disclosure provided herein, one of ordinary skill in the art will recognize a variety of circuitry that may be used to generate check node to variable node messages based in part on non-uniformly scaled Min1 and Min2 values in accordance with various embodiments of the invention.

Figure 7:
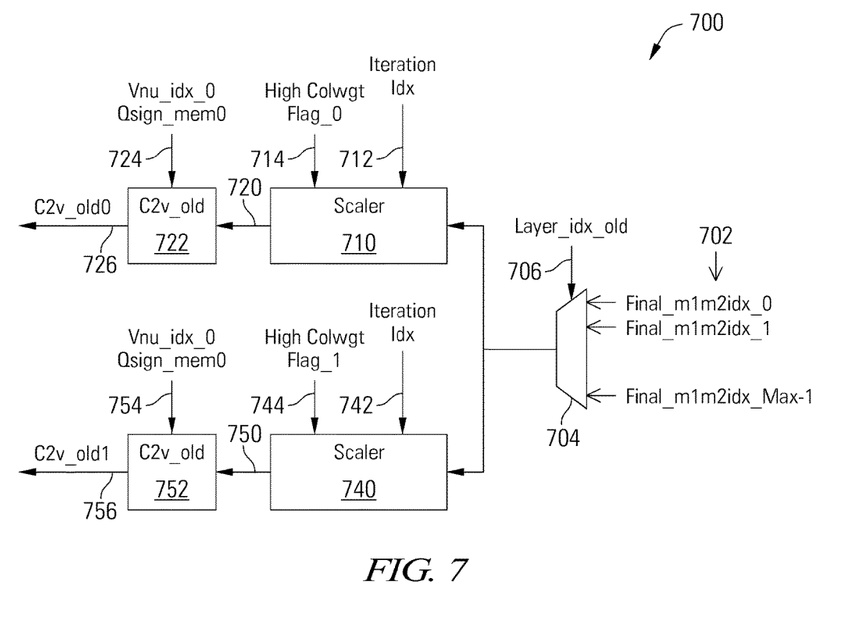
FIG. 7 depicts a previous layer C2V generator in a non-binary min-sum based layered low density parity check decoder with non-uniform scaling in accordance with one or more embodiments of the present invention.

Turning to FIG. 7, a previous layer check node to variable node generator 700 in a non-binary min-sum based layered low density parity check decoder with non-uniform scaling is depicted in accordance with one or more embodiments of the present invention. Although two data paths are depicted for use in a decoder that can process two circulants in parallel, any number of data paths can be included based on the decoder architecture. The final Min1/Min2/Min1 Index values 702 are received from a minimum and next minimum finder (e.g., 500), and the values needed to generate the current layer, previous iteration (or old) check node to variable node messages C2v_old0 726 and C2v_old1 756 are selected in multiplexer 704 based on the layer index 706. The selected Min1 and Min2 values are scaled in non-uniform scalers 710, 740, with the scaling factor selected based on the high column weight flag 714, 744 and in some embodiments on the global and/or local iteration numbers 712, 742. In some cases, the column weight is specified either as a high column weight or a low column weight, identified by a high column weight flag 714, 744. For irregular low density parity check codes with more than two different column weights, the number of different levels in the scaling can be the same as the number of different column weights, or different scaling levels can be applied to groups of different column weights.

The scaled Min1 and Min2 values 720, 750 are provided to check node to variable node message generators 722, 752, also referred to herein as R generators, which generate the check node to variable node messages C2v_old0 726 and C2v_old1 756 based on the scaled Min1 and Min2 values 720, 750 and on variable node indexes and sign values 724, 754 which identify the variable node for which each C2V message is being generated and the associated sign value. Thus, the non-uniform scaling is applied in the check node to variable node message generators, rather than in the minimum and next minimum finder circuit, and Min1/Min2 values are stored before C2V scaling.

Notably, non-uniform scaling in an irregular low density parity check decoder based at least in part on column weight can be applied in decoders that implement other decoding algorithms than the example min-sum based algorithm disclosed herein, applying non-uniform scaling to other types of values in the check node processor when generating check node to variable node messages.

The non-uniform scaling weights can be selected in any suitable manner to improve error detection and recovery, for example, by applying test scaling values in simulations of the decoder under various channel conditions. In some embodiments, more aggressive scaling is applied to values in the check node to variable node message generator associated with higher column weight symbols, and less aggressive scaling is applied when associated with lower column weight symbols. In some embodiments, the scaling level is swept back and forth in the check node to variable node message generator as the global and/or local iteration number is incremented, so that increasing and decreasing levels of scaling can be applied in different global and/or local iterations in order to help the codeword converge.

Figure 8:
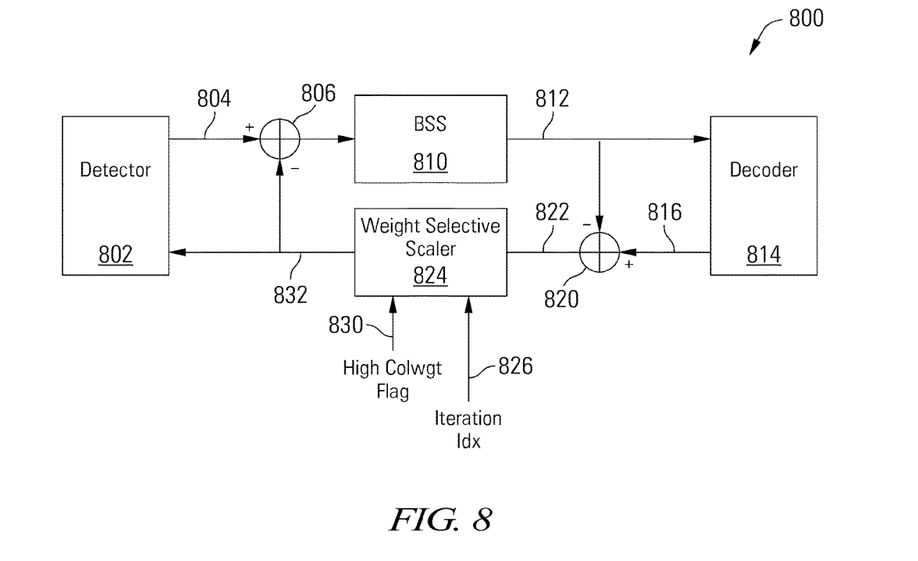
FIG. 8 depicts a block diagram of a data processing system with non-uniform scaling for decoding data encoded with an irregular low density parity check code in accordance with one or more embodiments of the present invention.

Turning to FIG. 8, a data processing system 800 with non-uniform scaling for decoding data encoded with an irregular low density parity check code is depicted in accordance with one or more embodiments of the present invention. In this embodiment, non-uniform scaling is applied to an output of a decoder, used to guide subsequent data detection applied in a detector 802. Thus, non-uniform scaling can be applied outside a decoder in some embodiments.

A data detector 802 applies a data detection algorithm to data to be processed and a data decoder 814 applies a data decoding algorithm in an iterative process as disclosed above. In some example embodiments, a bit selective scaling circuit 810 selectively scales an output of the detector 802 on a bit by bit basis according to any suitable algorithm. A non-uniform or weight selective scaler 824 scales an output of the decoder 814 based on the column weight 830 and global and/or local iteration number 826 as disclosed above. A subtraction circuit 806 can be used to subtract the scaled decoder output 832 from the detector output 804, and a subtraction circuit 820 can be used to subtract bit selectively scaled detector output 812 from decoder output 816 to yield a decoder output 822 to be non-uniformly scaled as shown.

Non-uniform scaling, whether applied in an irregular low density parity check decoder or outside a decoder in an irregular low density parity check data processing system, is effective in reducing failure rates such as sector failure rates in a hard disk drive, both during normal on-the-fly processing and during retry processing after initial read failures.

Figure 9:
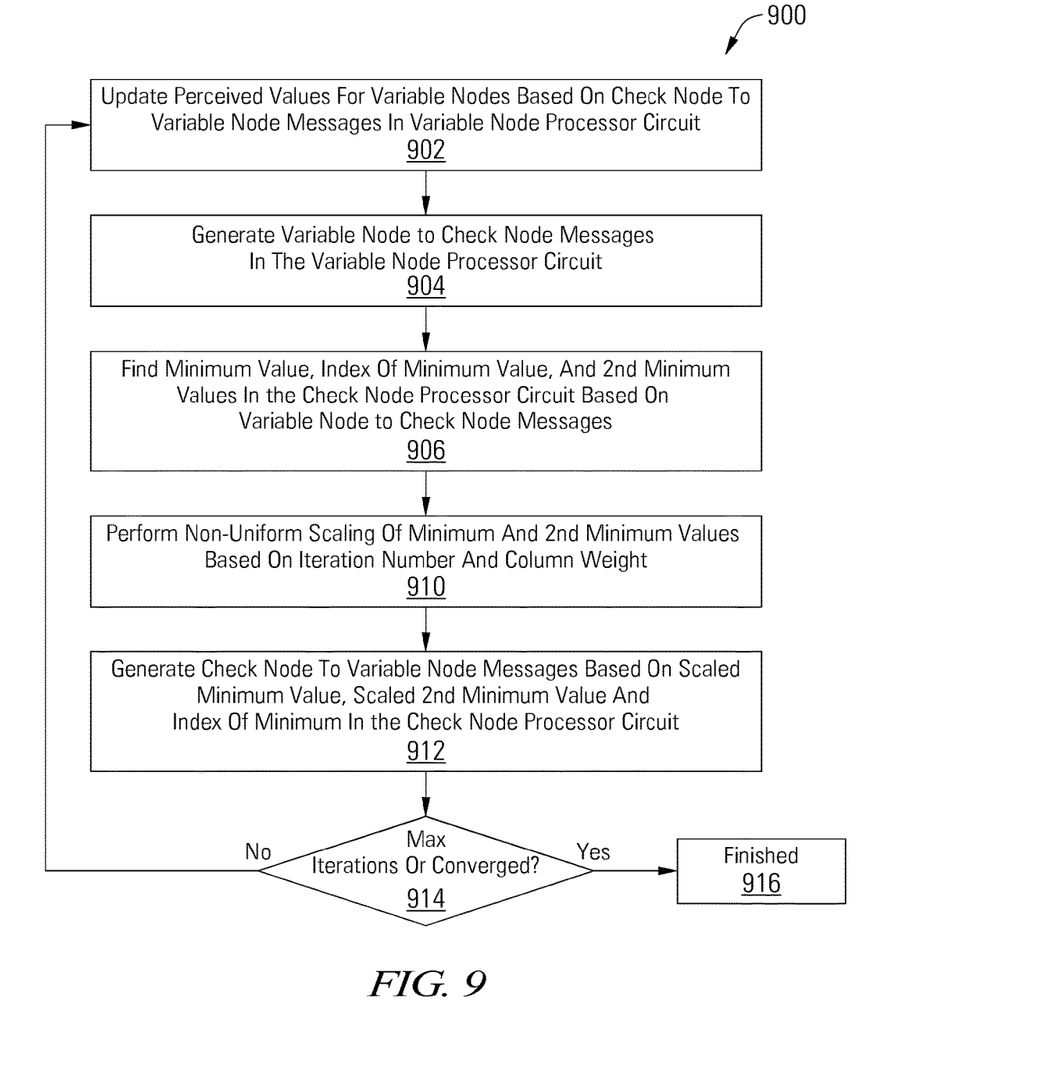
FIG. 9 depicts a flow diagram of an operation for decoding data encoded with an irregular low density parity check code, including non-uniform scaling, in accordance with one or more embodiments of the present invention.

Turning to FIG. 9, a flow diagram 900 depicts a method for decoding data encoded with an irregular low density parity check code, including applying non-uniform scaling, in accordance with one or more embodiments of the present invention. Following flow diagram 900, perceived values for variable nodes are updated based on check node to variable node messages in a variable node processor circuit. (Block 902) Variable node to check node messages are generated in the variable node processor circuit. (Block 904) Minimum, next minimum and index of minimum values are calculated in the check node processor based on the variable node to check node messages. (Block 906) Non-uniform scaling of the minimum and next minimum values is performed based on column weight, global iteration number and/or local iteration number. (Block 910) Check node to variable node messages are generated based in part on the scaled minimum value and the scaled second minimum value in the check node processor. (Block 912) A determination is made as to whether the maximum number of iterations has been reached in the decoder or whether the decoder has converged. (Block 914) If so, decoding is finished. (Block 916) If not, decoding continues at block 902.

Although the irregular low density parity check data processing system with non-uniform scaling disclosed herein is not limited to any particular application, several examples of applications are presented herein that benefit from embodiments of the present invention.

Figure 10:
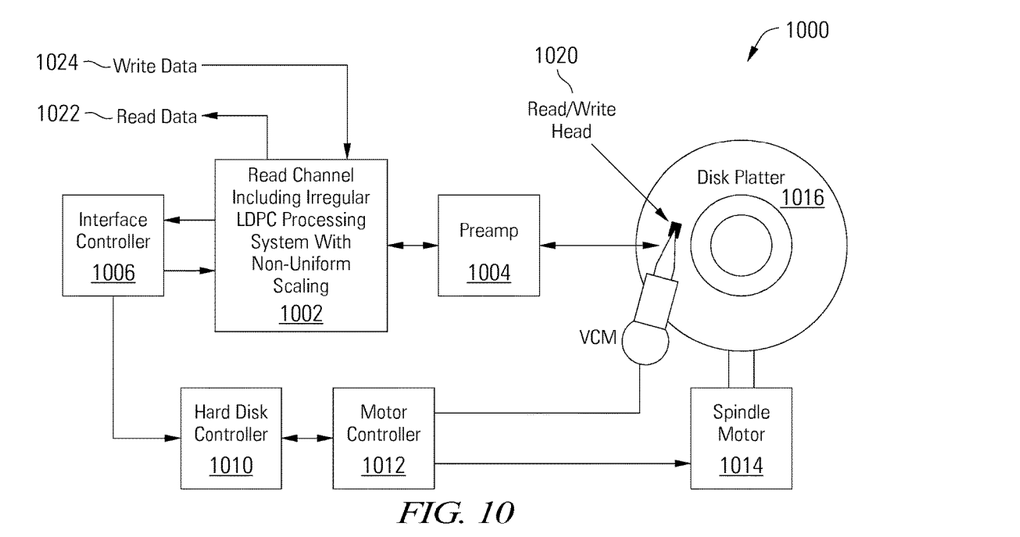
FIG. 10 depicts a storage system including a data processing system with non-uniform scaling for decoding data encoded with an irregular low density parity check code in accordance with one or more embodiments of the present invention.

Turning to FIG. 10, a storage system 1000 is illustrated as an example application of an irregular low density parity check data processing system with non-uniform scaling in accordance with some embodiments of the present invention. The storage system 1000 includes a read channel circuit 1002 with an irregular low density parity check data processing system with non-uniform scaling. Storage system 1000 may be, for example, a hard disk drive. Storage system 1000 also includes a preamplifier 1004, an interface controller 1006, a hard disk controller 1010, a motor controller 1012, a spindle motor 1014, a disk platter 1016, and a read/write head assembly 1020. Interface controller 1006 controls addressing and timing of data to/from disk platter 1016. The data on disk platter 1016 consists of groups of magnetic signals that may be detected by read/write head assembly 1020 when the assembly is properly positioned over disk platter 1016. In one embodiment, disk platter 1016 includes magnetic signals recorded in accordance with either a longitudinal or a perpendicular recording scheme.

In a typical read operation, read/write head assembly 1020 is accurately positioned by motor controller 1012 over a desired data track on disk platter 1016. Motor controller 1012 both positions read/write head assembly 1020 in relation to disk platter 1016 and drives spindle motor 1014 by moving read/write head assembly 1020 to the proper data track on disk platter 1016 under the direction of hard disk controller 1010. Spindle motor 1014 spins disk platter 1016 at a determined spin rate (RPMs). Once read/write head assembly 1020 is positioned adjacent the proper data track, magnetic signals representing data on disk platter 1016 are sensed by read/write head assembly 1020 as disk platter 1016 is rotated by spindle motor 1014. The sensed magnetic signals are provided as a continuous, minute analog signal representative of the magnetic data on disk platter 1016. This minute analog signal is transferred from read/write head assembly 1020 to read channel circuit 1002 via preamplifier 1004. Preamplifier 1004 is operable to amplify the minute analog signals accessed from disk platter 1016. In turn, read channel circuit 1002 digitizes the received analog signal and decodes the digital data in an irregular low density parity check data processing system with non-uniform scaling to recreate the information originally written to disk platter 1016. This data is provided as read data 1022 to a receiving circuit. A write operation is substantially the opposite of the preceding read operation with write data 1024 being provided to read channel circuit 1002. This data is then encoded and written to disk platter 1016.

It should be noted that storage system 1000 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such storage system 1000, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

In addition, it should be noted that storage system 1000 may be modified to include solid state memory that is used to store data in addition to the storage offered by disk platter 1016. This solid state memory may be used in parallel to disk platter 1016 to provide additional storage. In such a case, the solid state memory receives and provides information directly to read channel circuit 1002. Alternatively, the solid state memory may be used as a cache where it offers faster access time than that offered by disk platter 1016. In such a case, the solid state memory may be disposed between interface controller 1006 and read channel circuit 1002 where it operates as a pass through to disk platter 1016 when requested data is not available in the solid state memory or when the solid state memory does not have sufficient storage to hold a newly written data set. Based upon the disclosure provided herein, one of ordinary skill in the art will recognize a variety of storage systems including both disk platter 1016 and a solid state memory.

Figure 11:
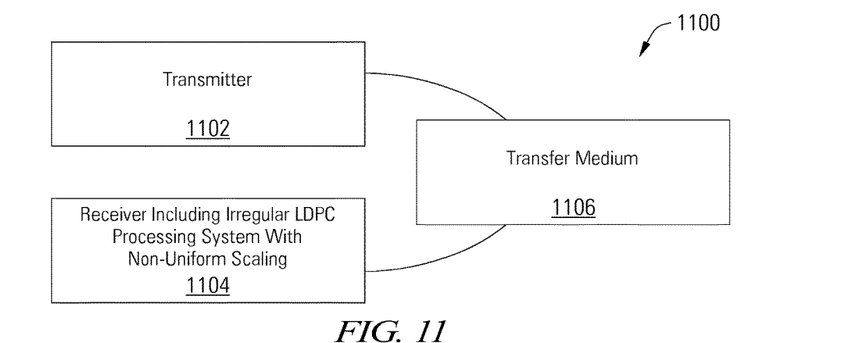
FIG. 11 depicts a wireless communication system including a data processing system with non-uniform scaling for decoding data encoded with an irregular low density parity check code in accordance with one or more embodiments of the present invention.

Turning to FIG. 11, a wireless communication system 1100 or data transmission device including a receiver 1104 with an irregular low density parity check data processing system with non-uniform scaling is shown in accordance with some embodiments of the present invention. The transmitter 1102 is operable to transmit encoded information via a transfer medium 1106 as is known in the art. The encoded data is received from transfer medium 1106 by receiver 1104. Receiver 1104 incorporates an irregular low density parity check data processing system with non-uniform scaling.

Figure 12:
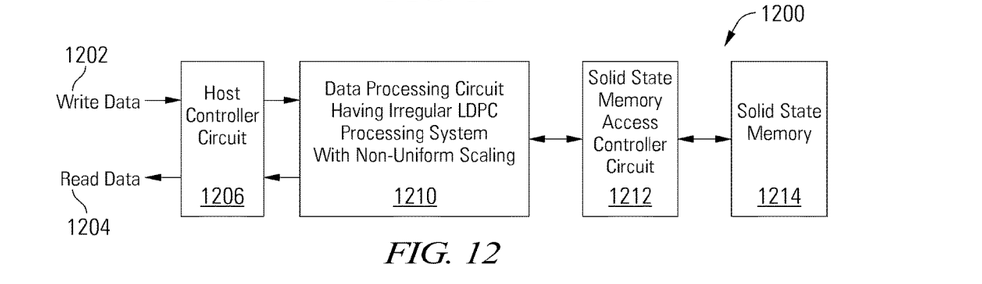
FIG. 12 depicts another storage system including a data processing system with non-uniform scaling for decoding data encoded with an irregular low density parity check code in accordance with one or more embodiments of the present invention.

Turning to FIG. 12, another storage system 1200 is shown that includes a data processing circuit 1210 having an irregular low density parity check data processing system with non-uniform scaling in accordance with one or more embodiments of the present invention. A host controller circuit 1206 receives data to be stored (i.e., write data 1202). This data is provided to data processing circuit 1210 where it is encoded using a low density parity check encoder according to an irregular low density parity check code. The encoded data is provided to a solid state memory access controller circuit 1212. Solid state memory access controller circuit 1212 can be any circuit known in the art that is capable of controlling access to and from a solid state memory. Solid state memory access controller circuit 1212 formats the received encoded data for transfer to a solid state memory 1214. Solid state memory 1214 can be any solid state memory known in the art. In some embodiments of the present invention, solid state memory 1214 is a flash memory. Later, when the previously written data is to be accessed from solid state memory 1214, solid state memory access controller circuit 1212 requests the data from solid state memory 1214 and provides the requested data to data processing circuit 1210. In turn, data processing circuit 1210 decodes the received data using an irregular low density parity check data processing system with non-uniform scaling. The decoded data is provided to host controller circuit 1206 where it is passed on as read data 1204.

It should be noted that the various blocks discussed in the above application may be implemented in integrated circuits along with other functionality. Such integrated circuits may include all of the functions of a given block, system or circuit, or a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, embodiments of the present invention provide novel systems, devices, methods and arrangements for irregular low density parity check data processing system with non-uniform scaling. While detailed descriptions of one or more embodiments of the invention have been given above, various alternatives, modifications, and equivalents will be apparent to those skilled in the art without varying from the spirit of the invention. Therefore, the above description should not be taken as limiting the scope of embodiments of the invention which are encompassed by the appended claims.

What is claimed is:

1. An apparatus for decoding data, comprising:
   a data decoding circuit configured to decode data encoded with an irregular low density parity check code comprising a parity check matrix with non-uniform column weights;
   at least one scaling circuit configured to scale values in the data decoding circuit with a scaling value that is dependent at least in part on a column weight of likelihood values being scaled;
   a data detector configured to apply a data detection algorithm to the data;
   a bit selective scaling circuit configured to scale an output of the data detector;
   a first subtraction circuit connected between the data detector and the bit selective scaling circuit, wherein the first subtraction circuit is configured to subtract an output of the at least one scaling circuit from the output of the data detector; and
   a second subtraction circuit connected between the data decoding circuit and the at least one scaling circuit, wherein the second subtraction circuit is configured to subtract an output of the bit selective scaling circuit from an output of the data decoding circuit.

2. The apparatus of claim 1, the data decoding circuit comprising a low density parity check decoder and the data detector, wherein data decoding applied by the low density parity check decoder and the data detection algorithm applied by the data detector are performed in iterative fashion.

3. The apparatus of claim 2, wherein the at least one scaling circuit is configured to scale the likelihood values in the data decoding circuit with the scaling value that is dependent at least in part on a number of global decoding and detection iterations in the low density parity check decoder and the data detector.

4. The apparatus of claim 2, wherein the at least one scaling circuit is connected between an output of the low density parity check decoder and an input of the data detector.

5. The apparatus of claim 4, wherein the at least one scaling circuit is operable to scale extrinsic messages from the data detector.

6. The apparatus of claim 1, wherein the data decoding circuit comprises a low density parity check decoder and wherein the second subtraction circuit is configured to subtract the output of the bit selective scaling circuit from an output of the low density parity check decoder.

7. The apparatus of claim 1, the data decoding circuit comprising a low density parity check decoder, wherein the at least one scaling circuit is located in the low density parity check decoder.

8. The apparatus of claim 7, wherein the values comprise log likelihood ratios.

9. The apparatus of claim 7, wherein the at least one scaling circuit is in a check node unit in the low density parity check decoder.

10. The apparatus of claim 7, wherein the low density parity check decoder comprises a min-sum based decoder, and wherein the check node unit comprises a min1, min2 and index of min1 detection circuit and a check node to variable node message generation circuit, wherein the at least one scaling circuit is configured to scale the min1, min2 in the check node to variable node message generation circuit.

11. The apparatus of claim 7, wherein the low density parity check decoder comprises a layer decoder, and wherein the at least one scaling circuit comprises a plurality of scaling circuits to scale likelihood messages for different layers.

12. The apparatus of claim 1, further comprising a read channel circuit in communication with a read/write head, wherein the read channel circuit includes at least one of the data decoding circuit, the at least one scaling circuit, the data detector, the bit selective scaling circuit, and the first subtraction circuit.

13. A method of decoding data, comprising:
    decoding, with a digital data decoding circuit, data encoded with an irregular low density parity check code comprising a parity check matrix with non-uniform column weights;
    applying, with a digital scaling circuit, a non-uniform scaling to likelihood values for the data during the decoding, wherein scaling factors for the non-uniform scaling are determined based at least in part on the column weights;
    applying, with a data detector, a data detection algorithm to the data;
    scaling an output of the data detector with a bit selective scaling circuit;
    subtracting, with a first subtraction circuit, an output of the digital scaling circuit from the output of the data detector; and
    subtracting, with a second subtraction circuit, an output of the bit selective scaling circuit from an output of the digital data decoding circuit.

14. The method of claim 13, wherein the decoding and the applying non-uniform scaling comprise:
    generating variable node to check node messages based on perceived values of variable nodes in an H matrix;
    generating check node to variable node messages based on the variable node to check node messages by finding a minimum and a second minimum of Q values in the variable node to check node messages, applying non-uniform scaling to the minimum and the second minimum of Q values, and generating the check node to variable node messages based at least in part on the non-uniformly scaled minimum and second minimum values; and
    updating the perceived values of the variable nodes based on the check node to variable node messages.

15. The method of claim 13, wherein applying the non-uniform scaling to likelihood values comprises scaling an output of an irregular low density parity check decoder.

16. The method of claim 13, wherein the decoding comprises applying a data detection algorithm to the data in a data detector circuit and applying a data decoding algorithm in an irregular low density parity check decoder in an iterative process.

17. The method of claim 16, wherein the scaling factors for the non-uniform scaling are determined based at least in part on an iteration number.

18. The method of claim 16, further comprising applying bit selective scaling to an output of the data detector circuit.

19. An irregular low density parity check decoding system comprising:
    a digital data decoding circuit that decodes data encoded with an irregular low density parity check coder;
    a digital scaling circuit included in the digital data decoding circuit, wherein the digital scaling circuit scales likelihood values by applying scaling values that are determined based on column weights in the irregular low density parity check code;
    a data detector configured to apply a data detection algorithm to the data;
    a bit selective scaling circuit configured to scale an output of the data detector;
    a first subtraction circuit connected between the data detector and the bit selective scaling circuit, wherein the first subtraction circuit is configured to subtract an output of the digital scaling circuit from the output of the data detector; and
    a second subtraction circuit connected between the digital data decoding circuit and the digital scaling circuit, wherein the second subtraction circuit is configured to subtract the output of the bit selective scaling circuit from an output of digital data decoding circuit.

20. The irregular low density parity check decoding system of claim 19, wherein the digital data decoding circuit comprises a min-sum based low density parity check layer decoder, and wherein the likelihood values comprises minimum and next minimum values.

* * * * *